United States Patent [19]

Ehlers

[11] Patent Number: 5,714,900
[45] Date of Patent: Feb. 3, 1998

[54] ELECTRICAL OVERSTRESS PROTECTION DEVICE

[75] Inventor: Eric R. Ehlers, Santa Rosa, Calif.

[73] Assignee: Hewlett-Packard Company, Palo Alto, Calif.

[21] Appl. No.: 631,098

[22] Filed: Apr. 12, 1996

[51] Int. Cl.[6] .................................................. H03K 5/08
[52] U.S. Cl. ............................ 327/325; 327/379; 327/505
[58] Field of Search ................................... 327/309, 310, 327/314, 320, 321, 322, 324, 325, 379, 493, 505, 521, 526, 551, 583; 333/12, 17.2

[56] References Cited

U.S. PATENT DOCUMENTS

| | | | |
|---|---|---|---|
| 4,390,919 | 6/1983 | Lesinski | 361/56 |
| 5,053,910 | 10/1991 | Goldstein | 361/111 |
| 5,200,876 | 4/1993 | Takeda et al. | 361/94 |
| 5,341,114 | 8/1994 | Calviello et al. | 333/17.2 |

FOREIGN PATENT DOCUMENTS

| | | |
|---|---|---|
| 0176440A1 | 4/1986 | European Pat. Off. . |
| 0552701A2 | 7/1993 | European Pat. Off. . |
| 0688079A2 | 12/1995 | European Pat. Off. . |
| 2284504 | 6/1995 | United Kingdom . |

Primary Examiner—Timothy P. Callahan
Assistant Examiner—Jeffrey Zweizig
Attorney, Agent, or Firm—Pamela Lau Kee

[57] ABSTRACT

An electrical overstress power protection device consists of a diode limiter array and an input and output electrical matching network. All of these functions are integrated monolithically on a single semiconductor chip which allows ease of use, small size, and high frequency operation. The device is used to protect instrument input and output circuitry from damage.

6 Claims, 2 Drawing Sheets

5,714,900

ELECTRICAL OVERSTRESS PROTECTION DEVICE

FIELD OF THE INVENTION

This invention relates to power protection devices for instrumentation. In particular, the invention addresses power protection for high frequency instrumentation.

BACKGROUND OF THE INVENTION

Modern electrical instrumentation has become increasingly sensitive to electrostatic discharge (ESD) and electrical overstress (EOS). This is particularly true for RF and microwave test instruments that extensively use semiconductor integrated circuits, as well as discrete semiconductor devices. This is partly due to the small geometries of the circuits required for high frequency performance and the properties of the semiconductor material.

Two types of devices and circuits have been used for ESD and EOS protection: shunt and series elements. The shunt protection device is typically a non-linear device that is normally in a high impedance state but at harmful (high) voltage levels enters a low impedance state and shunts potentially damaging current to ground. These non-linear shunt protection devices are often called Surge Protection Devices (SPDs). A series protection device is normally in a low impedance state but enters a high impedance state at high current levels and prevents propagation of potentially damaging voltage. A combination of shunt and series protection elements may provide the best protection from ESD and EOS.

RF and microwave test instruments are broadly classified as receivers, sources, or combinations of receivers and sources. Both receivers and sources benefit from circuits that provide protection from ESD and EOS. Protection circuits for high frequency RF and microwave test instruments have five special requirements. First, the transmitted voltage entering the instrument must be limited or "clamped" at a low voltage to prevent damage to sensitive components. This voltage is typically from 4 to 10 volts, positive or negative. Second, as a protection against fast voltage transients, the protection circuit must have a fast reaction time (typically sub-nanosecond). Third, the protection circuits are typically inserted into a transition line environment where they must be matched to the characteristic impedance of the line to prevent mismatch, loss of transmitted power, and undesired reflections. In addition, they should have low resistive loss to prevent loss of transmitted power. Fourth, the protection circuit must be more resistant to damage by ESD and EOS than the components that are being protected and they must have long-term reliability. Last, the protection circuit should have a low assembly cost.

Although a variety of SPDs have been used, most are not suitable for RF and microwave instruments. Spark gaps conduct at too high a voltage and have slow response times. Silicon-controlled rectifiers and triacs have slow response times. Metal oxide varistors have a capacitance that is too high to provide a good match at high frequencies. PIN diodes, perhaps with zener diodes to provide bias voltage, have been used with some success as SPDs at high frequencies, but typically do not have fast enough response time to protect high frequency integrated circuits. Conventional Si junction diodes also have slow response time.

Schottky barrier diodes (for example, Si or GaAs) have the required speed but have limited power handling capability unless large, high capacitance devices are used. In addition, commercially available Schottky diodes are difficult to use in the transmission line environment. It is difficult to achieve the required impedance match, low loss, and power handling over the broad frequency range required for RF and microwave test instruments. This is partly due to the number of diodes that must be used in the protection circuit and the package parasitics (capacitive and inductive) of each diode. For protection from both positive and negative voltage stress, diodes of both polarities must be used. In addition, if electrical bias is not available, series "stacks" of diodes must be used to achieve the required clamp voltage (typically 4 to 10 volts).

It would be convenient to have an electrical overstress protection device that shields sensitive output circuitry of RF and microwave test instruments from electrical overstress, electrostatic discharge, and reverse power. Additionally, it would be advantageous if this protective circuit would be integrated on a single semiconductor chip for low-cost, ease-of-assembly, and higher performance.

SUMMARY OF THE INVENTION

An electrical overstress protection device has an array of planar doped barrier (PDB) diodes that act as a shunt protection device integrated on a monolithic substrate. An input and output electrical matching network matches the impedance of the diode array to the characteristic impedance of the instruments input or output connector, respectively. The matching network incorporates a metal trace that functions as a series "fuse" (a series protection device). The protection device can be used at the input to instrument receivers and at the output of instrument sources. When used to protect a source, the protection device is often called a "reverse power protection" device.

The array of diodes consists of multiple series stacks of diodes distributed along a length of transmission line. Series stacks of diodes are used to achieve the desired clamping voltage without the need for an externally applied bias voltage.

DETAILED DESCRIPTION OF THE PREFERRED EMBODIMENTS

An electrical overstress protection device has an array of planar doped barrier (PDB) diodes that act as a shunt protection device integrated on a monolithic substrate. An input and output electrical matching network matches the impedance of the diode array to the characteristic impedance of the instruments input or output connector. The matching network incorporates a metal trace that functions as a series "fuse" (a series protection device).

Figure 1:
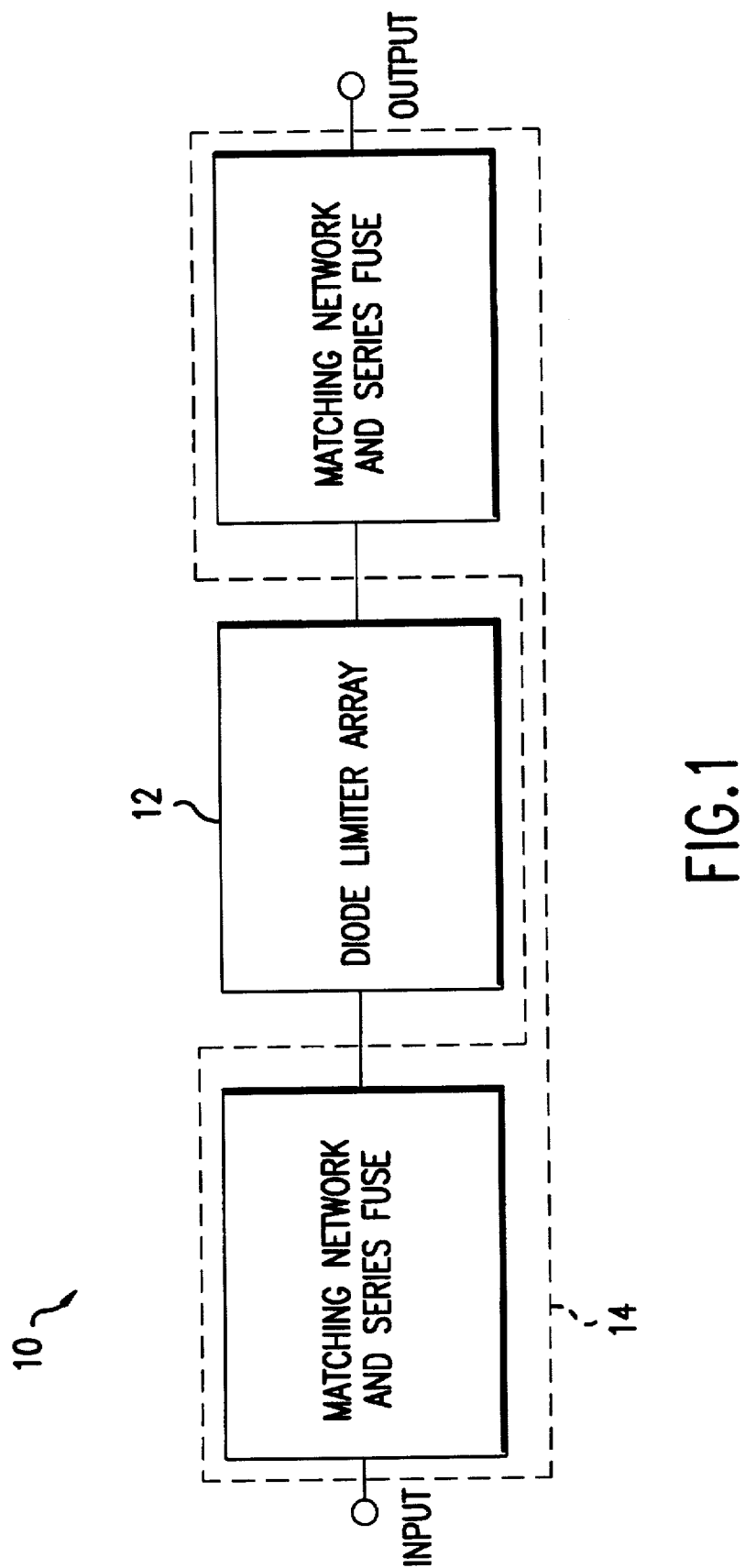
FIG. 1 illustrates a block diagram of an electrical overstress protection device.

FIG. 1 illustrates a block diagram of the electrical overstress protection device 10. The device 10 consists of a diode limiter array 12 and an input and output electrical matching network 14. By integrating the device 10 onto a single substrate, there is better impedance matching and lower insertion loss at high frequencies. The alternative to monolithic integration, such as discrete diodes and matching circuit elements, limits frequency response due to interconnect and packaging parasitics. Plus, the device is compact and easy-to-assemble.

Figure 2:
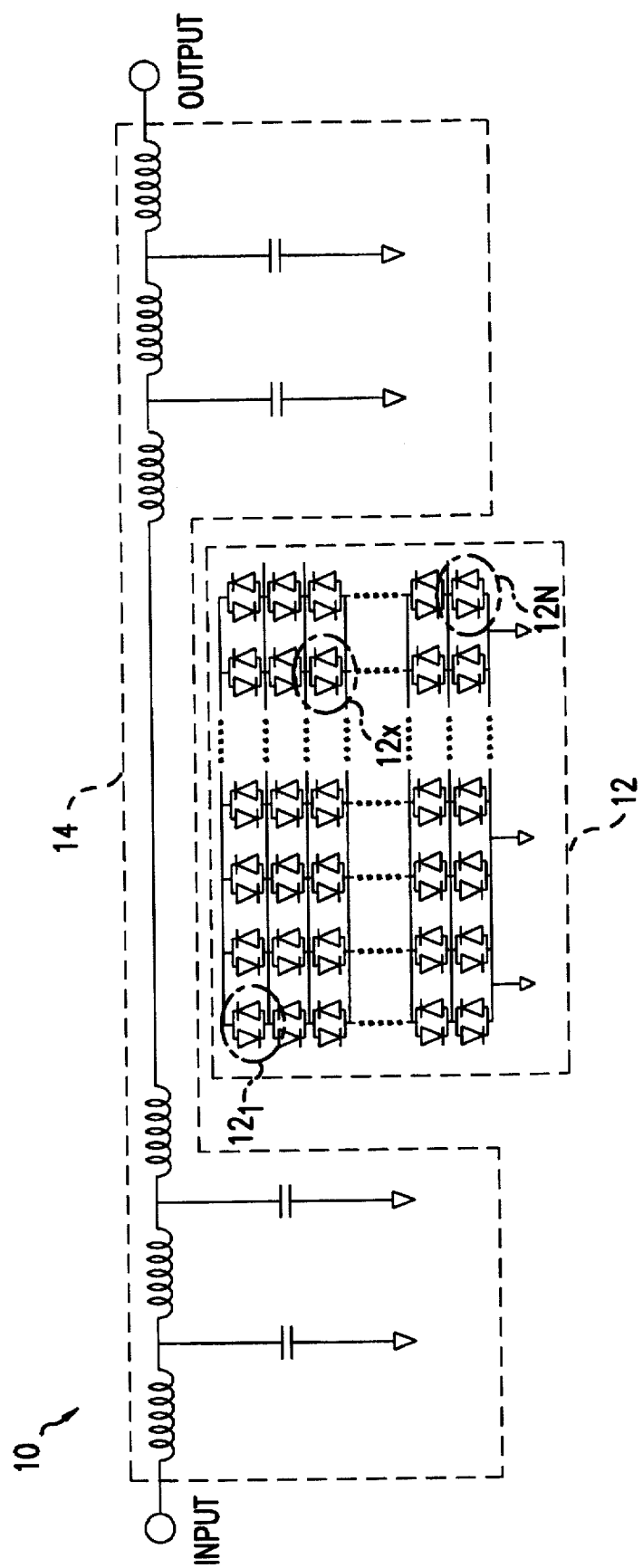
FIG. 2 schematically illustrates the diode limiter array shown in FIG. 1.

FIG. 2 schematically illustrates the diode limiter array 12 shown in FIG. 1. Each element $12_1 \ldots _N$ of the array 12 is a planar doped barrier (PDB) diode $12_x$ that is designed to function as an anti-parallel pair of conventional diodes. This means that each PDB diode $12_x$ conducts symmetrically with both polarities of voltages. There are a series of diodes, typically 5 or more, between the center conductor of the device and ground.

The series stack of diodes ensures that there is less conduction between the center conductor of the device and ground at low voltage and power levels resulting in lower harmonic distortion to the RF signals passing through the device. No external bias voltages are required which allows for easier use and assembly. At high voltages and power levels, the diodes conduct large currents to ground, thus protecting the instruments' input or output circuitry. In addition, a series stack of diodes has lower capacitance than a single diode with the same total diode active area.

Multiple stacks of diodes have a lower series resistance than a single diode stack with the same total diode active area. The lower resistance results in lower transmission loss at low voltage levels and more constant voltage clamping at high voltage levels. The thermal resistance of the device 10 is lowered by spreading the heat generation over a larger area of the chip. This increases reliability by lowering the junction temperature and increasing the burnout level. In addition, multiple stacks of diodes provide a distributed transmission line structure that can be more easily impedance matched for high frequency operation.

PDB diodes $12_x$ conduct equally with positive and negative voltages. Since conduction occurs with each polarity of applied voltage, heating occurs equally in all diode elements regardless of the applied voltage polarity which results in greater power handling and resistance to ESD damage. In addition, even harmonic distortion is canceled and only odd harmonics are generated.

The electrical overstress protection devices 10 can be fabricated in semiconductor compounds, in particular GaAs, as described by Malik on the manufacture of PDB diodes in U.S. Pat. No. 4,410,902 "Planar Doped Barrier Semiconductor Device". In the present embodiment, the dimensions are 1350 microns length, 900 microns width, and 100 microns thick. There are input, output, and two ground bond pads for multiple wire bonds to ground.

PDB diodes have the required speed to protect high frequency integrated circuits (cutoff frequency $F_c$ above 400 GHz can be achieved). These diodes are inherently more resistant to damage by ESD and EOS than Schottky diodes of the same capacitance.

A symmetric PDB diode conducts current in both polarities. Consequently, only a single PDB diode is required for protection from positive and negative voltage stresses to allow for a smaller chip size. The symmetric PDB has a lower capacitance than two Schottky diodes with the same current handling capability to allow for high frequency operation and shorter distributed transmission lines. This allows more equal distribution of current in all diodes of the array at high frequencies which results in more constant clamping voltage and power handling as a function of frequency.

The PDB diode capacitance is approximately independent of voltage so that the impedance match of the device is independent of applied voltages (at voltages below turn-on). The forward and reverse characteristics of the diode can be matched to minimize even harmonic generation. The barrier height of the PDB diodes can be fabricated to be higher than the barrier height of Schottky diodes. This permits fewer diodes in the series stack to achieve the same voltage clamp, which in turn allows a smaller chip size.

There is no current rectification when the electrical stress is a sinusoidal voltage. Therefore, the metal interconnects have no DC current flowing through them and this reduces the failure rate due to electromigration.

I claim:

1. An electrical overstress protection device for electrical circuits comprising:

a diode limiter array that includes M series of N pairs of parallel diodes connected serially, wherein M and $N \geq 2$, each pair of parallel diodes including a forward-biased and a reverse-biased diode;

an input matching network; and an output electrical matching network.

2. An electrical overstress protection device, as defined in claim 1, wherein each of the N pairs of parallel diodes are formed on a monolithic substrate.

3. An electrical overstress protection device, as defined in claim 2, wherein each diode of each pair of parallel diodes is a planar doped barrier diode.

4. An electrical overstress protection device, as defined in claim 3, wherein each pair of parallel diodes is a planar doped barrier diode with a substantially symmetric current versus voltage characteristic.

5. An electrical overstress protection device, as defined in claim 1, wherein each series of N pairs of parallel diodes contains at least five pairs of parallel diodes.

6. An electrical overstress protection device, as defined in claim 1, wherein the matching networks behave as non-linear series protection elements.

* * * * *